United States Patent
Gu et al.

(10) Patent No.: US 10,361,317 B2
(45) Date of Patent: Jul. 23, 2019

(54) THIN FILM TRANSISTOR AND METHOD FOR MANUFACTURING THE SAME, ARRAY SUBSTRATE AND DISPLAY DEVICE

(71) Applicants: BOE TECHNOLOGY GROUP CO., LTD., Beijing (CN); CHONGQING BOE OPTOELECTRONICS TECHNOLOGY CO., LTD., Chongqing (CN)

(72) Inventors: Keke Gu, Beijing (CN); Ni Yang, Beijing (CN); Wei Hu, Beijing (CN); Zhongping Gou, Beijing (CN); Xin Liu, Beijing (CN); Zhijian Qi, Beijing (CN); Yusong Hou, Beijing (CN); Shuai Chen, Beijing (CN)

(73) Assignees: BOE TECHNOLOGY GROUP CO., LTD., Beijing (CN); CHONGQING BOE OPTOELECTRONICS TECHNOLOGY CO., LTD., Beibei District, Chongqing (CN)

( * ) Notice: Subject to any disclaimer, the term of this patent is extended or adjusted under 35 U.S.C. 154(b) by 0 days.

(21) Appl. No.: 15/501,797

(22) PCT Filed: Sep. 5, 2016

(86) PCT No.: PCT/CN2016/098090
§ 371 (c)(1),
(2) Date: Feb. 3, 2017

(87) PCT Pub. No.: WO2017/067338
PCT Pub. Date: Apr. 27, 2017

(65) Prior Publication Data
US 2018/0219104 A1  Aug. 2, 2018

(30) Foreign Application Priority Data
Oct. 20, 2015 (CN) .......................... 2015 1 0684583

(51) Int. Cl.
H01L 29/786 (2006.01)
H01L 27/12 (2006.01)
(Continued)

(52) U.S. Cl.
CPC ...... *H01L 29/78696* (2013.01); *G02F 1/1368* (2013.01); *G02F 1/133345* (2013.01);
(Continued)

(58) Field of Classification Search
None
See application file for complete search history.

(56) References Cited

U.S. PATENT DOCUMENTS

2004/0066483 A1  4/2004  Kim
2004/0095519 A1* 5/2004  Kim .................. G02F 1/1368
                                                        349/43
(Continued)

FOREIGN PATENT DOCUMENTS

CN  1479147 A  3/2004
CN  1275084 C  9/2006
(Continued)

OTHER PUBLICATIONS

First Office Action for Chinese Application No. 201510684583.9, dated Jul. 3, 2017, 7 Pages.
International Search Report and Written Opinion for Application No. PCT/CN2016/098090, dated Dec. 8, 2016, 9 Pages.

*Primary Examiner* — Reema Patel
*Assistant Examiner* — Steven M Christopher
(74) *Attorney, Agent, or Firm* — Brooks Kushman P.C.

(57) ABSTRACT

A TFT and a method for manufacturing the same, an array substrate and a display device are provided. The TFT includes a first electrode pattern and a second electrode pattern arranged at an identical layer. The first electrode pattern includes a first strip-like portion extending in a first direction, and the second electrode pattern includes a bend-
(Continued)

ing portion surrounding a first end of the first strip-like portion. The second electrode pattern further includes a second strip-like portion extending from a first end of the bending portion in the first direction. A channel formation region of the TFT includes a region between the bending portion and the first strip-like portion, and a region between the second strip-like portion and the first strip-like portion.

15 Claims, 2 Drawing Sheets

(51) Int. Cl.
*H01L 29/08* (2006.01)
*H01L 29/10* (2006.01)
*G02F 1/1333* (2006.01)
*G02F 1/1368* (2006.01)

(52) U.S. Cl.
CPC .............. *H01L 27/12* (2013.01); *H01L 29/08* (2013.01); *H01L 29/10* (2013.01); *H01L 29/1029* (2013.01); *H01L 29/786* (2013.01)

(56) References Cited

U.S. PATENT DOCUMENTS

| | | | | |
|---|---|---|---|---|
| 2008/0042134 | A1* | 2/2008 | Jung | G02F 1/1368 257/59 |
| 2008/0296575 | A1 | 12/2008 | Li et al. | |
| 2012/0112195 | A1 | 5/2012 | Li et al. | |
| 2014/0008656 | A1* | 1/2014 | Shim | H01L 29/66765 257/59 |
| 2015/0028342 | A1* | 1/2015 | Kim | H01L 21/283 257/72 |
| 2015/0129882 | A1* | 5/2015 | Jiang | H01L 29/41733 257/72 |

FOREIGN PATENT DOCUMENTS

| | | |
|---|---|---|
| CN | 101315950 A | 12/2008 |
| CN | 101354505 A | 1/2009 |
| CN | 103412449 A | 11/2013 |
| CN | 105140300 A | 12/2015 |

\* cited by examiner

--Prior Art--

THIN FILM TRANSISTOR AND METHOD FOR MANUFACTURING THE SAME, ARRAY SUBSTRATE AND DISPLAY DEVICE

CROSS-REFERENCE TO RELATED APPLICATIONS

This application is the U.S. national phase of PCT Application No. PCT/CN2016/098090 filed on Sep. 5, 2016, which claims priority to Chinese Patent Application No. 201510684583.9 filed on Oct. 5, 2016, the disclosures of which are incorporated in their entirety by reference herein.

TECHNICAL FIELD

The present disclosure relates to the field of display technology, in particular to a thin film transistor (TFT) and a method for manufacturing the same, an array substrate and a display device.

BACKGROUND

In the related art, a TFT liquid Crystal Display (TFT-LCD) is used to display an image mainly by controlling rotation of liquid crystal molecules through an electric field generated between a pixel electrode and a common electrode, so there is a strict correspondence between a potential at the pixel electrode and a grayscale value of a pixel. Whether or not the potential at the pixel electrode reaches a predetermined value mainly depends on parameters of a TFT, e.g., a breakover current. In the case of an identical process, a width-to-length ratio (W/L, where W represents a channel width and L represents a channel length) of the TFT is very important for the performance of the TFT.

Due to the limit of the process, it is very difficult to reduce the channel length of the TFT in the related art, and usually the channel width is increased so as to improve the performance of the TFT, e.g., a channel may be extended in any direction. However, a size of the TFT may be increased accordingly, and then an area of a transparent region may be reduced. As a result, a pixel aperture ratio may be reduced, and a display effect may be adversely affected.

SUMMARY

An object of the present disclosure is to provide a TFT and a method for manufacturing the same, an array substrate and a display device, so as to increase a width-to-length ratio of the TFT without decreasing a pixel aperture ratio.

In one aspect, a TFT is provided in the present disclosure, including a first electrode pattern and a second electrode pattern arranged at an identical layer. The first electrode pattern includes a first strip-like portion extending in a first direction, and the second electrode pattern includes a bending portion surrounding a first end of the first strip-like portion. The second electrode pattern further includes a second strip-like portion extending from a first end of the bending portion in the first direction. A channel formation region of the TFT includes a region between the bending portion and the first strip-like portion, and a region between the second strip-like portion and the first strip-like portion.

Optionally, the first electrode pattern further includes a body portion connected to a second end of the first strip-like member.

Optionally, the first electrode pattern and the second electrode pattern are each covered with an insulation layer, and a via-hole for the body portion is formed in the insulation layer.

Optionally, the via-hole is of a circular, semi-circular, square or rectangular shape.

Optionally, one end of the second strip-like portion is aligned with a lateral edge of the body portion, and the channel formation region of the TFT further includes a region between the second strip-like portion and the body portion.

Optionally, the TFT further includes an active layer pattern, and the channel formation region of the TFT is located within a region where the active layer pattern is located.

Optionally, the TFT further includes a gate electrode pattern, and a region where the gate electrode pattern is located includes the channel formation region.

Optionally, the TFT further includes an active layer pattern, a projection of the channel formation region of the TFT in a second direction is located within a projection of a region where the active layer pattern is located in the second direction, and the second direction is perpendicular to a plane where the gate electrode pattern is located.

Optionally, the TFT further includes a gate electrode pattern, and a projection of the channel formation region of the TFT in the second direction is located within a region where the gate electrode pattern is located.

Optionally, a lateral side of the second strip-like portion away from the bending portion is aligned with a lateral side of the body portion away from the bending portion, and the channel formation region of the TFT further includes a region between the second strip-like portion and the body portion.

Optionally, the bending portion is of a U-like or L-like shape.

In another aspect, a method for manufacturing the above-mentioned TFT is provided in the present disclosure, including a step of forming a conductive layer including the first electrode pattern and the second electrode pattern.

In yet another aspect, an array substrate is provided in the present disclosure, including the above-mentioned TFT arranged at a pixel region.

In still yet another aspect, a display device is provided in the present disclosure, including the above-mentioned array substrate.

According to the present disclosure, through the second strip-like portion of the second electrode pattern, it is able to increase a channel width without increasing a size of the TFT, thereby to improve the performance of the TFT or reduce the size thereof. In addition, the TFT may be applied to the TFT-LCD in the related art by merely changing a shape of a pattern used in a patterning process, so it is conductive to reduce the manufacture cost and improve the performance of the TFT.

Of course, it is unnecessary for the products and the method in the present disclosure to achieve all of the above-mentioned advantages.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Figure 1:
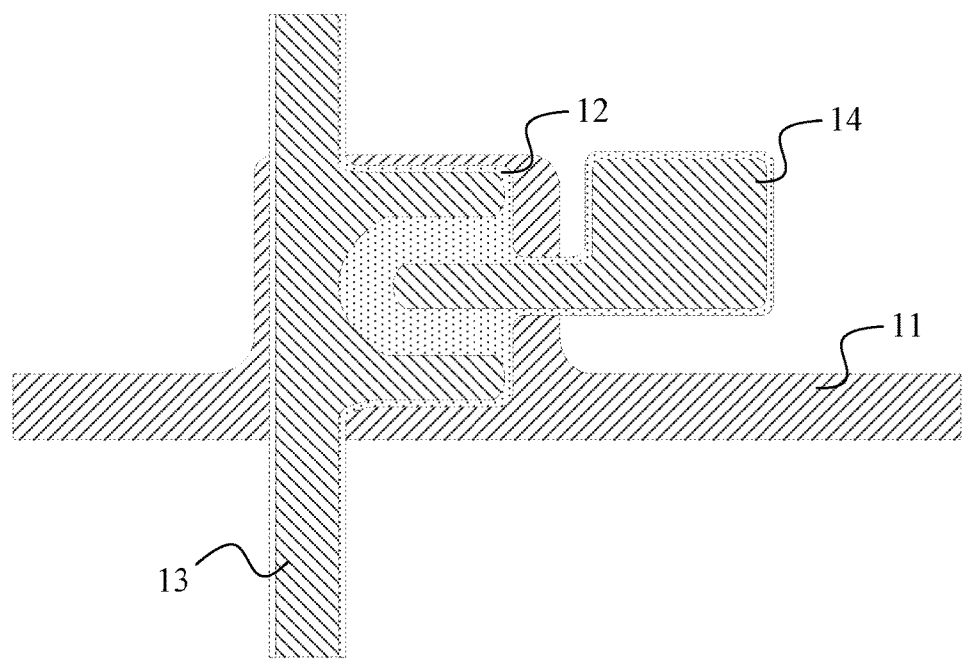
FIG. 1 is a schematic view showing a TFT in the related art.

As shown in FIG. 1, which is a schematic view showing a TFT in the related art, a channel of the TFT refers to an active layer 12 within a U-shaped region between a source electrode 13 and a drain electrode 14, and a channel formation region is located within a region where a gate electrode 11 is located. Due to the limit of the process, it is very difficult to reduce a channel length of the TFT (i.e., a distance between the source electrode 13 and the drain electrode 14 in FIG. 1). Hence, in order to improve the performance of the TFT, a channel width (i.e., a trajectory length of the U-shaped channel in FIG. 1) may be increased. For example, the channel may be extended in any direction. However, at this time, a size of the TFT may be increased accordingly, and then an area of a transparent region may be reduced. As a result, a pixel aperture ratio may be reduced, and a display effect may be adversely affected.

Figure 2:
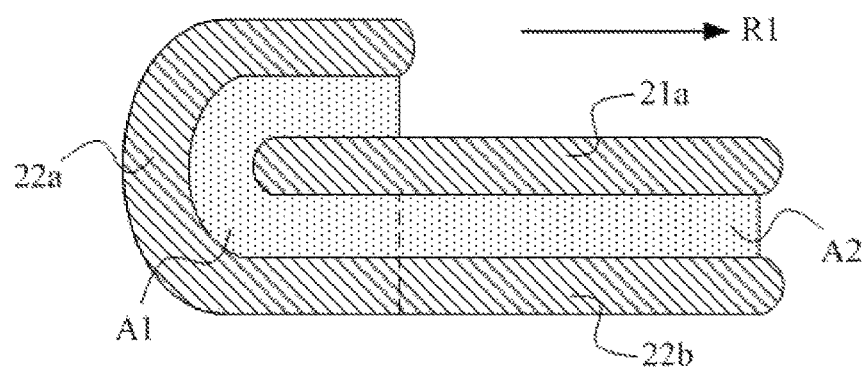
FIG. 2 is a topical schematic view showing a TFT in some embodiments of the present disclosure.

As shown in FIG. 2, which is a topical schematic view showing a TFT in some embodiments of the present disclosure, the TFT includes a first electrode pattern and a second electrode pattern arranged at an identical layer. To be specific, the first electrode pattern in FIG. 2 includes a first strip-like portion 21a extending in a first direction R1, and the second electrode pattern includes a bending portion 22a surrounding a first end of the first strip-like portion 21a (a left end in FIG. 2). In addition, the second electrode pattern further includes a second strip-like portion 22b extending from a first end of the bending portion 22a (an end indicated by a dotted line in FIG. 2) in the first direction R1. Based on the above-mentioned structure, a channel formation region of the TFT includes a region A1 between the bending portion 22a and the first strip-like portion 21a and a region A2 between the second strip-like portion 22b and the first strip-like portion 21a. It should be appreciated that, the first electrode pattern is used to form one of a source electrode and a drain electrode, while the second electrode pattern is used to form the other one thereof.

It should be appreciated that, the first electrode pattern and the second electrode pattern in the embodiments of the present disclosure are arranged at an identical layer, so they may be formed simultaneously using a predetermined conductor material through a single patterning process. As compared with a patterning process for forming the drain electrode and the source electrode in the related art, it is able to form the TFT in the embodiments of the present disclosure by merely changing a shape of the pattern used in the patterning process. The other structures of the TFT not mentioned herein are known in the art and may be provided in accordance with a type of the TFT, which will not be particularly defined herein. For example, a channel of the TFT may be located within a layer-like structure formed mainly by a semiconductor material, and this layer-like structure may be in direct contact with the first electrode pattern and the second electrode pattern hereinabove.

According to the embodiments of the present disclosure, through the second strip-like portion of the second electrode pattern, it is able to increase a channel width without increasing a size of the TFT, thereby to improve the performance of the TFT or reduce the size thereof. In addition, the TFT may be applied to the TFT-LCD in the related art by merely changing a shape of a pattern used in a patterning process, so it is conductive to reduce the manufacture cost and improve the performance of the TFT.

Figure 3:
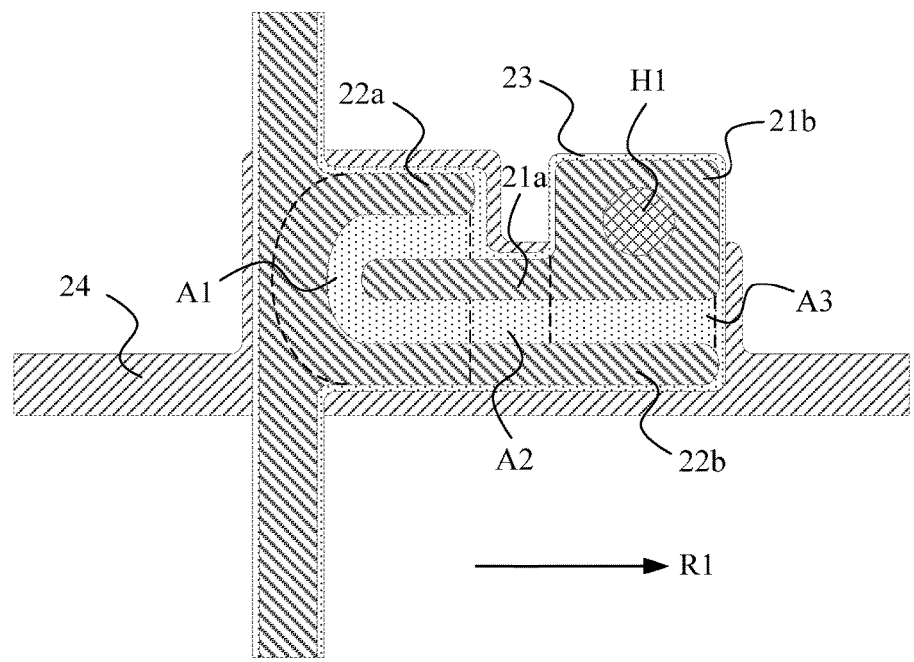
FIG. 3 is a schematic view showing a TFT in some embodiments of the present disclosure.

As shown in FIG. 3, which is a schematic view showing the TFT in some embodiments of the present disclosure, the TFT may include, like the TFT in FIG. 2, the first electrode pattern and the second electrode pattern arranged at an identical layer. The first electrode pattern includes the first strip-like portion 21a extending in the first direction R1, and the second electrode pattern includes the bending portion 22a surrounding the first end of the first strip-like portion 21a (a left end in FIG. 3) and the second strip-like portion 22b extending from the first end of the bending member 22a (an end indicated by a dotted line in FIG. 3) in the first direction R1.

Based on the structure of the TFT as shown in FIG. 2, the TFT in some embodiments of the present disclosure may be further provided with the following features.

Firstly, the TFT may include an active layer pattern 23, and the channel formation region of the TFT is located within a region where the active layer pattern is located. It should be appreciated that, the active layer pattern 23 may be made of a semiconductor material, and it may be in contact with the first electrode pattern and the second electrode pattern, so as to form a channel of the TFT within a region between the first electrode pattern and the second electrode pattern.

Secondly, the TFT may further include a gate electrode pattern 24, and the channel formation region of the TFT is located within a region where the gate electrode pattern 24 is located. Depending on an operation principle of the TFT, the channel formation region of the TFT needs to be covered by a gate electrode of the TFT, so the active layer pattern 23 needs to overlap the gate electrode pattern 24 at least at the channel formation region. It should be appreciated that, in order to enable the active layer pattern 23 to be electrically insulated from the gate electrode pattern 24, an insulation layer (also called as gate insulation layer) may be arranged therebetween, which is not particularly defined herein.

Figure 4:
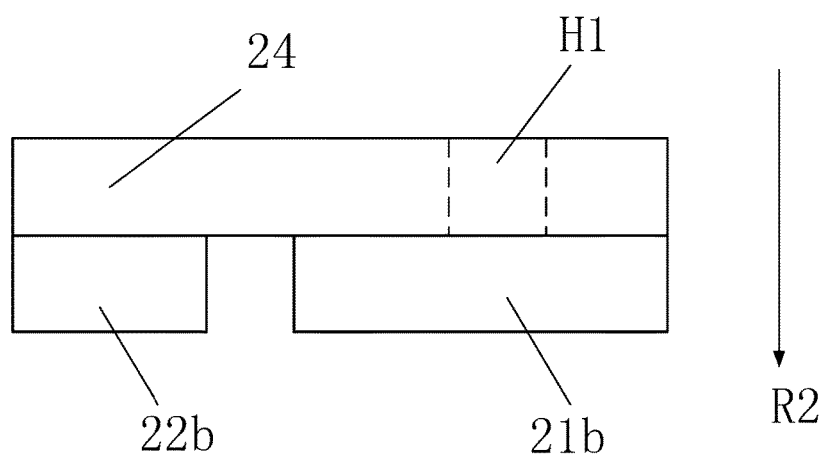
FIG. 4 is a schematic view showing a TFT in some embodiments of the present disclosure.

Thirdly, the first electrode pattern may further include a body portion 21b connected to a second end of the first strip-like portion 21a (a right end in FIG. 3). Hence, the body portion 21b may be used to form an electrical connector for the first electrode pattern. For example, the first electrode pattern and the second electrode pattern may be each covered by an insulation layer, and a via-hole H1, through which the body portion 21b is electrically connected, may be formed in the insulation layer. Hence, a conductor layer may be formed, and electrically connected to the first electrode pattern through the via-hole H1. The via-hole H1 may be of a circular, semi-circular, square or rectangular shape, which will not be particularly defined herein. In some embodiments of the present disclosure, the second strip-like portion 22b, the body portion 21b, the insulation layer 24 and the via-hole H1 may be provided as shown in FIG. 4. In FIG. 4, a second direction R2 is perpendicular to planes where the second strip-like portion 22b, the body portion 21b and the insulation layer 24 are located respectively.

Fourthly, one end of the second strip-like portion 22b is aligned with a lateral edge of the body portion 21b, e.g., in FIG. 3, a right end of the second strip-like portion 22b is aligned with a right edge of the body portion 21b. Apart from the region A1 between the bending portion 22a and the first strip-like portion 21a and the region A2 between the second strip-like portion 22b and the first strip-like portion 21a, the channel formation region of the TFT may further include a region A3 between the second strip-like portion 22b and the body portion 21b. It is found that, the regions A1, A2 and A3 are all covered by the active layer pattern 23 and the gate electrode pattern 24, so the channels at these regions may be used to generate the voltage between the first electrode pattern and the second electrode pattern.

It should be appreciated that, although the TFT in FIG. 3 has the above-mentioned features, in some other embodiments of the present disclosure, any one or ones of the above-mentioned features may be selected according to the selected application scenario, so as to achieve the desired technical effect. Of course, the TFT in FIG. 3 obviously has the features of the TFT in FIG. 2, so it is also able to increase the channel width without increasing a size of the TFT, reduce the manufacture cost and improve the performance of the TFT.

In addition, in some embodiments of the present disclosure, the bending portion 22a may further be L-shaped (the U-shaped and the L-shaped bending portion 22a may both be provided with a predetermined bending degree). In other words, according to the practical need, the bending portion 22a may be U-shaped so as to surround the first end of the first strip-like portion 21a, or be L-shaped so as to partially surround the first end of the first strip-like portion 21a, so as to provide the TFT with a larger channel width in the case of a given size of the TFT in compared with the TFT in the related art.

It should be appreciated that, the TFT may be an N-type or P-type TFT, and it may be of a top-gate structure or a bottom-gate structure. In addition, it may an amorphous silicon (a-Si) TFT, a polycrystalline silicon (p-Si) TFT, a monocrystalline silicon TFT, or a metal oxide semiconductor TFT, which will not be particularly defined herein. Depending on the type of the TFT, it is able to determine whether the first electrode pattern corresponds to the source electrode or the drain electrode of the TFT in a specific application scenario. Particularly, in the case that the source electrode and the drain electrode of the TFT are arranged symmetrically, they may not be differentiated from each other.

Based on an identical concept, a method for manufacturing the above-mentioned TFT is further provided in some embodiments of the present disclosure. The method includes a step of forming a conductive layer including the first electrode pattern and the second electrode pattern. It should be appreciated that, the first electrode pattern and the second electrode pattern are arranged at an identical layer, so they may be formed simultaneously in an identical conductive layer using a predetermined conductor material through a single patterning process. As compared with a patterning process for forming the drain electrode and the source electrode in the related art, it is able to form the TFT in the embodiments of the present disclosure by merely changing a shape of the pattern used in the patterning process. As a result, it is able to improve the performance of the TFT or reduce the size of the TFT, thereby to reduce the manufacture cost and improve the performance of the product.

It should be appreciated that, depending on the type and the structure of the TFT, the method in the embodiments of the present disclosure may include any known steps in the related art of forming the structures other than the conductive layer , which will not be particularly defined herein.

Based on an identical inventive concept, an array substrate is provided in some embodiments of the present disclosure, which includes the above-mentioned TFT arranged at a pixel region. For example, the array substrate may be applied to a TFT-LCD or an active-matrix organic light-emitting diode (AMOLED) display device. Through the above-mentioned TFT, it is able to increase a refresh rate and a pixel resolution, reduce the manufacture cost and improve the performance of the product.

Based on the above-mentioned inventive concept, a display device is further provided in some embodiments of the present disclosure, including the above-mentioned array substrate. It should be appreciated that, the display device may be any product or member having a display function, such as a display panel, an electronic paper, a mobile phone, a flat-panel computer, a television, a laptop computer, a digital photo frame or a navigator. Identically, according to the display device in the embodiments of the present disclosure, it is able to increase the refresh rate and the pixel resolution, reduce the manufacture cost and improve the performance of the product.

It should be appreciated that, such words as "on" and "under" are merely used for simplifying the description, and they merely refer to a direction or a position relationship as shown in the drawings, but shall not be used to indicate or imply that the device or member must be arranged or operated at a specific position. Unless otherwise defined, such words as "install", "connect" and "connected to" shall have the general meaning, e.g., they may refer to a fixed connection state, a removable connection state or an integral connection state; mechanical connection or electrical connection; or direct connection or indirect connection through an intermediate medium; or communication between two elements. The above-mentioned words may have the common meaning understood by a person of ordinary skills.

Although with a large amount of details, the person of ordinary skills may know that the embodiments of the present disclosure may be implemented without these details. In some embodiments of the present disclosure, the methods, structures and techniques known in the art are not particularly defined herein, so as not to confuse the understanding of the present disclosure.

It should be further appreciated that, in order to simplify the embodiments of the present disclosure and help to understand one or more aspects of the present disclosure, the respective features mentioned above may also be applied to any single embodiment, drawing or the description thereto. However, the method in the embodiments of the present disclosure shall not be construed as that the present disclosure claims more features than those specifically defined in the respective claims. More definitely, as those defined in the claims, the inventive aspect lies in that the features fewer than those mentioned in the aforementioned single embodiment. Hence, the claims following a specific embodiment may be definitely incorporated into the specific embodiment, and each claim itself may serve as a separate embodiment of the present disclosure.

It should be further appreciated that, the above embodiments are for illustrative purposes only, but shall not be construed as limiting the present disclosure. In addition, the person of ordinary skills may design any alternative embodiments without departing from the scope defined by the appended claims. In the claims, any reference signals shall not be construed as limiting the claims. The word "include" shall not be construed as excluding any element or step not defined in the claims. Such words as "one" or "one of" are merely used to represent the existence of at least one member, rather than to limit the number thereof. The embodiments of the present disclosure may be implemented by means of hardware including several elements or a computer with appropriate programs. In the device claim where several units have been defined, some of these units may be reflected by an identical hardware item. Such words as "first" and "second" used in the specification and claims are merely used to differentiate different components rather than to represent any order, number or importance.

Finally, it should be noted that, the above are merely the preferred embodiments of the present disclosure, but the present disclosure is not limited thereto. Although the present disclosure is described in details in conjunction with the embodiments hereinabove, a person skilled in the art may make further modifications to the embodiments hereinabove or make equivalent replacements to a part or all the features thereof without departing from the spirit of the present disclosure, and these modifications and equivalent replacements shall also fall within the scope of the present disclosure.

What is claimed is:

1. A thin film transistor (TFT), comprising a first electrode pattern and a second electrode pattern arranged at an identical layer, the TFT further comprising an active layer pattern,
   wherein the first electrode pattern comprises a first strip-like portion extending in a first direction;
   the second electrode pattern comprises a bending portion surrounding a first end of the first strip-like portion;
   the second electrode pattern further comprises a second strip-like portion extending from a first end of the bending portion in the first direction;
   the first electrode pattern further comprises a body portion connected to a second end of the first strip-like portion and extending in the first direction, and a width of the body portion is larger than a width of the first strip-like portion in a second direction perpendicular to the first direction; and
   the active layer pattern comprises a channel formation region between the bending portion and the first strip-like portion and between the second strip-like portion and the first strip-like portion and between the second strip-like portion and the body portion;
   the second strip-like portion is adjacent to a side edge of the body portion, wherein an orthographic projection of the active layer pattern completely covers the side edge of the body portion and a side edge of the second strip-like portion.

2. The TFT according to claim 1, wherein the first electrode pattern and the second electrode pattern are each covered by an insulation layer, and a via-hole, through which the body portions is electrically connected, is formed in the insulation layer.

3. The TFT according to claim 2, wherein the via-hole is of a circular, semi-circular, square or rectangular shape.

4. The TFT according to claim 1, further comprising a gate electrode pattern, wherein an orthographic projection of the gate electrode completely covers the channel formation region.

5. The TFT according to claim 1, wherein the orthographic projection of the active layer pattern completely covers a side edge of the bending portion, a side edge of the first strip-like portion, the side edge of the body portion, and the side edge of the second strip-like portion.

6. The TFT according to claim 1, wherein the bending portion is U-shaped.

7. An array substrate comprising the TFT according to claim 1 arranged at a pixel region.

8. A display device comprising the array substrate according to claim 7.

9. The TFT according to claim 1, wherein the bending portion is L-shaped.

10. A thin film transistor (TFT), comprising a first electrode pattern and a second electrode pattern arranged at an identical layer, the TFT further comprising a gate electrode pattern and an active layer pattern,
    wherein the first electrode pattern comprises a first strip-like portion extending in a first direction;
    the second electrode pattern comprises a bending portion surrounding a first end of the first strip-like portion;
    the second electrode pattern further comprises a second strip-like portion extending from a first end of the bending portion in the first direction;
    wherein the first electrode pattern further comprises a body portion connected to a second end of the first strip-like portion and extending in the first direction, and a width of the body portion is larger than a width of the first strip-like portion in a second direction perpendicular to the first direction;
    the second strip-like portion is adjacent to the body portion;
    the active layer pattern comprises a channel formation region between the bending portion and the first strip-like portion and between the second strip-like portion and the first strip-like portion and between the second strip-like portion and the body portion;
    wherein an orthographic projection of the gate electrode completely covers the channel formation region;
    wherein the orthographic projection of the gate electrode pattern at least partially overlaps an orthographic projection of the body portion in a direction perpendicular to a plane where the first electrode pattern is located.

11. The TFT according to claim 4, wherein an orthographic projection of the second electrode pattern is within an orthographic projection of the gate electrode pattern in a direction perpendicular to a plane where the first electrode pattern is located.

12. The TFT according to claim 1, wherein a length of the second strip-like portion in the first direction is equal to a sum of a length of the channel formation region between the first strip-like portion and the second strip-like portion in the first direction and a length of the body portion in the first direction.

13. The TFT according to claim 1, wherein the first electrode pattern is a drain electrode, and the second electrode pattern is a source electrode.

14. The TFT according to claim 1, wherein in the first direction, an endpoint of the second strip-like portion away from the bending portion is at an extension line of an edge line of the body portion away from the bending portion.

15. A thin film transistor (TFT), comprising a first electrode pattern and a second electrode pattern arranged at an identical layer, the TFT further comprising an active layer pattern,
    wherein the first electrode pattern comprises a first strip-like portion extending in a first direction;

the second electrode pattern comprises a bending portion surrounding a first end of the first strip-like portion;

the second electrode pattern further comprises a second strip-like portion extending from a first end of the bending portion in the first direction;

wherein the first electrode pattern further comprises a body portion connected to a second end of the first strip-like portion and extending in the first direction, and a width of the body portion is larger than a width of the first strip-like portion in a second direction perpendicular to the first direction;

the second strip-like portion is adjacent to the body portion;

the active layer pattern comprises a channel formation region between the bending portion and the first strip-like portion and between the second strip-like portion and the first strip-like portion and between the second strip-like portion and the body portion;

wherein the body portion further comprises a first side edge perpendicular to the first direction and away from the bending portion, a vertical distance between an extension line of the of first side edge extending in a direction perpendicular to the first direction and a first end of the bending portion is equivalent to a vertical distance between an endpoint of the second strip-like portion away from the bending portion and the first end of the bending portion;

the endpoint of the second strip-like portion away from the bending portion is at the extension line of the of first side edge extending in the direction perpendicular to the first direction.

* * * * *